(12) United States Patent
Hsu et al.

(10) Patent No.: US 8,846,453 B1
(45) Date of Patent: Sep. 30, 2014

(54) SEMICONDUCTOR PACKAGE STRUCTURE AND METHOD OF MANUFACTURING THE SAME

(71) Applicant: Inpaq Technology Co., Ltd., Miaoli County (TW)

(72) Inventors: Chu-Chun Hsu, Miaoli County (TW); Wei-Luen Hsu, Taichung (TW); Hong-Sheng Ke, Changhua County (TW); Yao-Ming Yang, Chiayi (TW); Yu-Chia Chang, Taichung (TW)

(73) Assignee: Inpaq Technology Co., Ltd., Miaoli County (TW)

( * ) Notice: Subject to any disclaimer, the term of this patent is extended or adjusted under 35 U.S.C. 154(b) by 0 days.

(21) Appl. No.: 13/794,927

(22) Filed: Mar. 12, 2013

(51) Int. Cl.
*H01L 21/00* (2006.01)
*H01L 23/00* (2006.01)

(52) U.S. Cl.
CPC ............... *H01L 24/03* (2013.01); *H01L 24/09* (2013.01)
USPC ........... 438/113; 438/107; 438/124; 438/126; 438/458; 257/E21.15

(58) Field of Classification Search
USPC ............. 438/33, 68, 107, 108, 113, 124, 126, 438/455, 456, 458; 257/E21.15
See application file for complete search history.

(56) References Cited

U.S. PATENT DOCUMENTS

| 8,486,803 | B2* | 7/2013 | Huang et al. | 438/458 |
| 8,580,619 | B2* | 11/2013 | Oda et al. | 438/118 |
| 2002/0192867 | A1* | 12/2002 | Nishiyama | 438/110 |
| 2007/0273046 | A1* | 11/2007 | Theuss | 257/783 |

* cited by examiner

*Primary Examiner* — Jasmine Clark
(74) *Attorney, Agent, or Firm* — Li & Cai Intellectual Property (USA) Office

(57) ABSTRACT

A semiconductor package structure includes a chip unit, a package unit and an electrode unit. The chip unit includes at least one semiconductor chip. The semiconductor chip has an upper surface, a lower surface, and a surrounding peripheral surface connected between the upper and the lower surfaces, and the semiconductor chip has a first conductive pad and a second conductive pad disposed on the lower surface thereof. The package unit includes a package body covering the upper surface and the surrounding peripheral surface of the semiconductor chip. The package body has a first lateral portion and a second lateral portion respectively formed on two opposite lateral sides thereof. The electrode unit includes a first electrode structure covering the first lateral portion and a second electrode structure covering the second lateral portion. The first and the second electrode structures respectively electrically contact the first and the second conductive pads.

7 Claims, 12 Drawing Sheets

US 8,846,453 B1

SEMICONDUCTOR PACKAGE STRUCTURE AND METHOD OF MANUFACTURING THE SAME

BACKGROUND OF THE INVENTION

1. Field of the Invention

The instant disclosure relates to a package structure and a method of manufacturing the same, and more particularly to a semiconductor package structure and a method of manufacturing the same.

2. Description of Related Art

The conventional technologies for designing and manufacturing a bi-directional blocking transient voltage suppressor (TVS) is still confronted with a technical difficulty that the base of a TVS device is connected to a terminal of floating potential. Typically, the bi-directional blocking TVS is implemented with symmetric NPN/PNP configuration with identical emitter-base and collector-base breakdown voltage. However, such implementation often leads to a floating base that further leads to difficulties of voltage variations over time, i.e., the dv/dt. The voltage variation over time further leads to the leakage current concerns due to the facts that when the base is floating, the voltage change dv/dt causes the equivalent capacitor generating charging and discharging currents that increase the leakage current.

The transient voltage suppressors (TVS) are commonly applied for protecting integrated circuits from damages due to the inadvertent occurrence of an over voltage imposed onto the integrated circuit. An integrated circuit is designed to operate over a normal range of voltages. However, in situations such as electrostatic discharge (ESD), electrical fast transients and lightning, an unexpected and an uncontrollable high voltage may accidentally strike onto the circuit. The TVS devices are required to serve the protection functions to circumvent the damages that are likely to occur to the integrated circuits when such over voltage conditions occur. As increasing number of devices are implemented with the integrated circuits that are vulnerable to over voltage damages, demands for TVS protection are also increased. Exemplary applications of TVS can be found in the USB power and data line protection, Digital video interface, high speed Ethernet, Notebook computers, monitors and flat panel displays.

SUMMARY OF THE INVENTION

One aspect of the instant disclosure relates to a semiconductor package structure and a method of manufacturing the same.

One of the embodiments of the instant disclosure provides a semiconductor package structure, comprising: a chip unit, a package unit and an electrode unit. The chip unit includes at least one semiconductor chip, wherein the at least one semiconductor chip has an upper surface, a lower surface opposite to the upper surface, and a surrounding peripheral surface connected between the upper surface and the lower surface, and the at least one semiconductor chip has a first conductive pad and a second conductive pad disposed on the lower surface thereof. The package unit includes a package body covering the upper surface and the surrounding peripheral surface of the at least one semiconductor chip, wherein the package body has a first lateral portion and a second lateral portion respectively formed on two opposite lateral sides thereof. The electrode unit includes a first electrode structure covering the first lateral portion of the package body and a second electrode structure covering the second lateral portion of the package body, wherein the first electrode structure and the second electrode structure are separated from each other by a predetermined distance, and the first electrode structure and the second electrode structure respectively electrically contact the first conductive pad and the second conductive pad.

Another one of the embodiments of the instant disclosure provides a method of manufacturing a semiconductor package structure, comprising: cutting a wafer to form a plurality of semiconductor chips separated from each other, wherein each semiconductor chip has an upper surface, a lower surface opposite to the upper surface, and a surrounding peripheral surface connected between the upper surface and the lower surface, and each semiconductor chip has a first conductive pad and a second conductive pad disposed on the lower surface thereof; reversing and positioning each semiconductor chip in a receiving space for covering the first conductive pad and the second conductive pad of the corresponding semiconductor chip; filling the receiving space with a package material to enclose the semiconductor chips; cutting the package material to form a plurality of package bodies, wherein the upper surface and the surrounding peripheral surface of each semiconductor chip are covered by the corresponding package body, and each package body has a first lateral portion and a second lateral portion respectively formed on two opposite lateral sides thereof; and then forming a plurality of first electrode structures and a plurality of second electrode structures, wherein each first electrode structure is formed for covering the first lateral portion of the corresponding package body and electrically contacting the first conductive pad of the corresponding semiconductor chip, and each second electrode structure is formed for covering the second lateral portion of the corresponding package body and electrically contacting the second conductive pad of the corresponding semiconductor chip.

More precisely, the step of forming the first electrode structures and the second electrode structures further comprises: forming a plurality of first inner conductive layers and a plurality of second inner conductive layers, wherein each first inner conductive layer is formed for covering the first lateral portion of the corresponding package body and electrically contacting the first conductive pad of the corresponding semiconductor chip, and each second inner conductive layer is formed for covering the second lateral portion of the corresponding package body and electrically contacting the second conductive pad of the corresponding semiconductor chip; forming a plurality of first middle conductive layers and a plurality of second middle conductive layers, wherein each first middle conductive layer is formed for covering the corresponding first inner conductive layer, and each second middle conductive layer is formed for covering the corresponding second inner conductive layer; and then forming a plurality of first outer conductive layers and a plurality of second outer conductive layers, wherein each first outer conductive layer is formed for covering the corresponding first middle conductive layer, and each second outer conductive layer is formed for covering the corresponding second middle conductive layer.

More precisely, the step of forming the first electrode structures and the second electrode structures further comprises: forming a plurality of conductive materials, wherein each conductive material is formed for enclosing the corresponding package body and the corresponding semiconductor chip; forming a plurality of insulative materials, wherein every two insulative materials are formed for respectively covering two opposite end portions of the corresponding conductive material; removing one part of each conductive material to form a plurality of first inner conductive layers and a plurality of second inner conductive layers, wherein each first inner conductive layer is formed for covering the first lateral portion of the corresponding package body and electrically contacting the first conductive pad of the corresponding semiconductor chip, and each second inner conductive layer is formed for covering the second lateral portion of the corresponding package body and electrically contacting the second conductive pad of the corresponding semiconductor chip; removing the other insulative materials to expose the first inner conductive layers and the second inner conductive layers; forming a plurality of first middle conductive layers and a plurality of second middle conductive layers, wherein each first middle conductive layer is formed for covering the corresponding first inner conductive layer, and each second middle conductive layer is formed for covering the corresponding second inner conductive layer; and then forming a plurality of first outer conductive layers and a plurality of second outer conductive layers, wherein each first outer conductive layer is formed for covering the corresponding first middle conductive layer, and each second outer conductive layer is formed for covering the corresponding second middle conductive layer.

Therefore, the package unit includes a package body covering the upper surface and the surrounding peripheral surface of the at least one semiconductor chip, and the receiving space is filled with a package material to enclose the semiconductor chips, thus the semiconductor package structure of the instant disclosure can be manufactured without using a chip-carrying substrate and a wire-bonding process.

To further understand the techniques, means and effects of the instant disclosure applied for achieving the prescribed objectives, the following detailed descriptions and appended drawings are hereby referred, such that, through which, the purposes, features and aspects of the instant disclosure can be thoroughly and concretely appreciated. However, the appended drawings are provided solely for reference and illustration, without any intention to limit the instant disclosure.

DETAILED DESCRIPTION OF THE PREFERRED EMBODIMENTS

Figure 1:
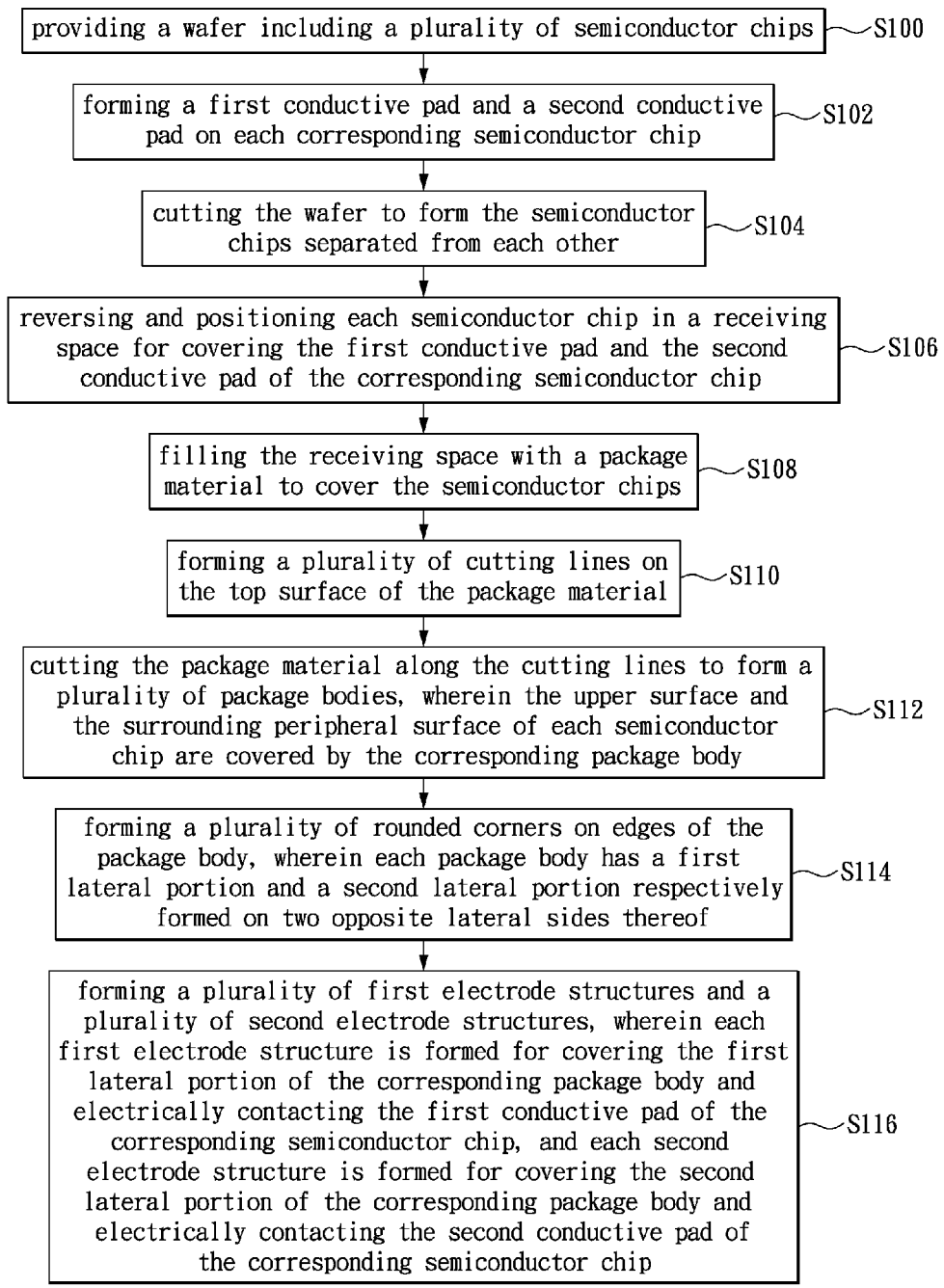
FIG. 1 shows a flowchart of the method of manufacturing a semiconductor package structure according to the instant disclosure.
Figure 2A:
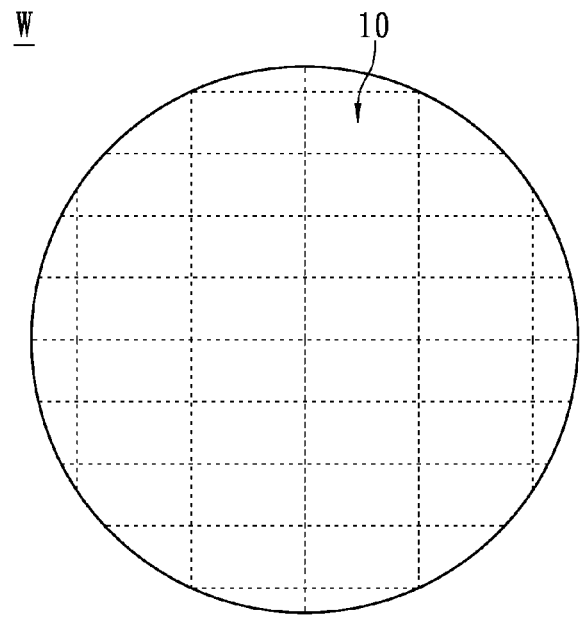
FIG. 2A is a schematic diagram of the step S100 of the method of manufacturing a semiconductor package structure according to the instant disclosure.

Referring to FIG. 1, FIG. 2A to FIG. 2I and FIG. 3, where the instant disclosure provides a method of manufacturing a semiconductor package structure Z, comprising the steps of:

First, referring to FIG. 1 and FIG. 2A, the step S100 is that: providing a wafer W including a plurality of semiconductor chips 10, and the semiconductor chips 10 have not been cut from the wafer W, and each semiconductor chip 10 may be a diode chip or any function chip such as transient voltage suppressor (TVS) formed by semiconductor processes in advance.

Figure 2B:
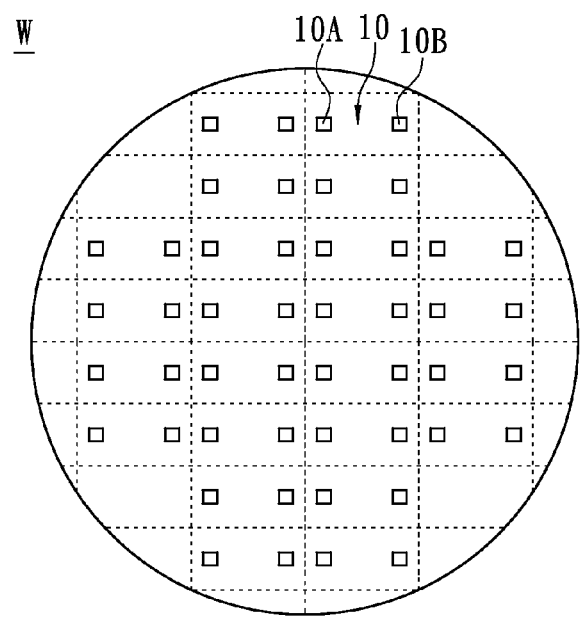
FIG. 2B is a schematic diagram of the step S102 of the method of manufacturing a semiconductor package structure according to the instant disclosure.

Next, referring to FIG. 1 and FIG. 2B, the step S102 is that: forming a first conductive pad 10A and a second conductive pad 10B on each corresponding semiconductor chip 10 by screen printing. However, the above-mentioned method for forming the first conductive pad 10A and the second conductive pad 10B is merely an example and is not meant to limit the instant disclosure.

Then, referring to FIG. 1, FIG. 2B, FIG. 2C and FIG. 3A, the step S104 is that: cutting the wafer W along the virtual lines on the wafer W of the FIG. 2B to form the semiconductor chips 10 separated from each other. In addition, each semiconductor chip 10 has an upper surface 100, a lower surface 101 opposite to the upper surface 100, and a surrounding peripheral surface 102 connected between the upper surface 100 and the lower surface 101, and each semiconductor chip 10 has a first conductive pad 10A and a second conductive pad 10B disposed on the lower surface 101 of the semiconductor chip 10.

Figure 2C:
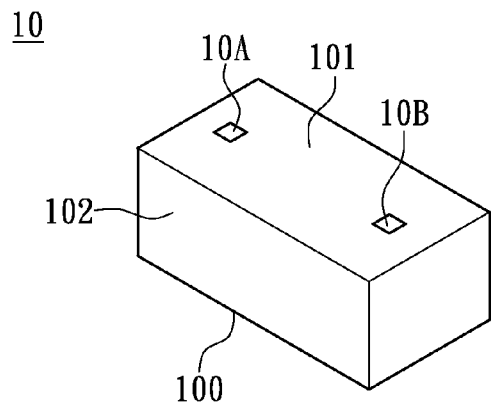
FIG. 2C is a schematic diagram of the step S104 of the method of manufacturing a semiconductor package structure according to the instant disclosure.
Figure 2D:
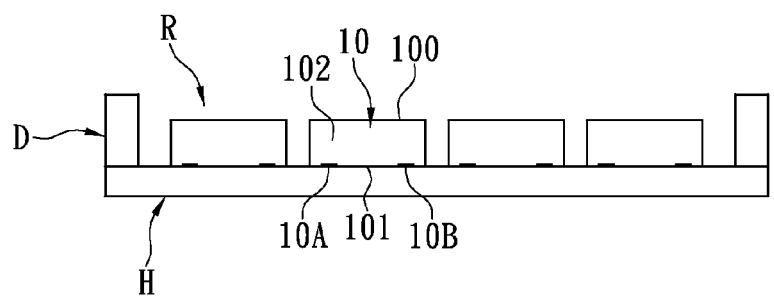
FIG. 2D is a schematic diagram of the step S106 of the method of manufacturing a semiconductor package structure according to the instant disclosure.
Figure 2E:
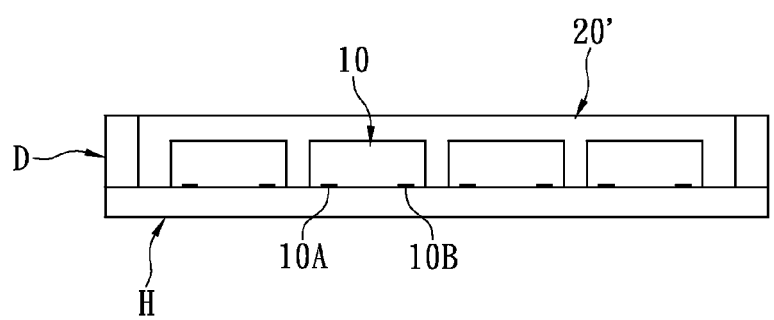
FIG. 2E is a schematic diagram of the step S108 of the method of manufacturing a semiconductor package structure according to the instant disclosure.

Afterward, referring to FIG. 1, FIG. 2C and FIG. 2D, the step S106 is that: reversing (or overturning) and positioning each semiconductor chip 10 in a receiving space R for covering the first conductive pad 10A and the second conductive pad 10B of the corresponding semiconductor chip 10. More precisely, the step of reversing and positioning each semiconductor chip 10 further comprises: adhesively placing each reversed semiconductor chip 10 on an adhesive substrate H that is received in the receiving space R, and the semiconductor chips 10 are separated from each other. For example, the adhesive substrate H includes a surrounding dam D disposed thereon to define the size of the receiving space R.

After that, referring to FIG. 1, FIG. 2D, FIG. 2E and FIG. 3B, the step S108 is that: filling the receiving space R with a package material 20' to cover or enclose the semiconductor chips 10. For example, the package material 20' can be formed by any opaque package material, such as epoxy or silicone etc.

Figure 2F:
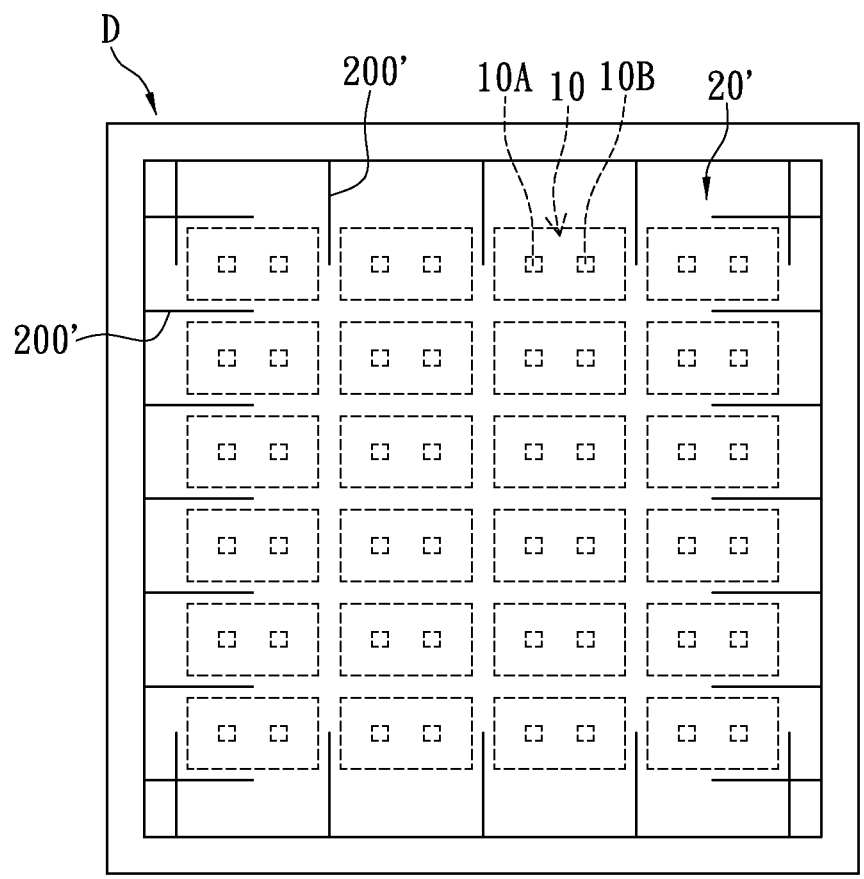
FIG. 2F is a schematic diagram of the step S110 of the method of manufacturing a semiconductor package structure according to the instant disclosure.

Next, referring to FIG. 1 and FIG. 2F, the step S110 is that: forming a plurality of cutting lines 200' on the top surface of the package material 20'.

Figure 2G:
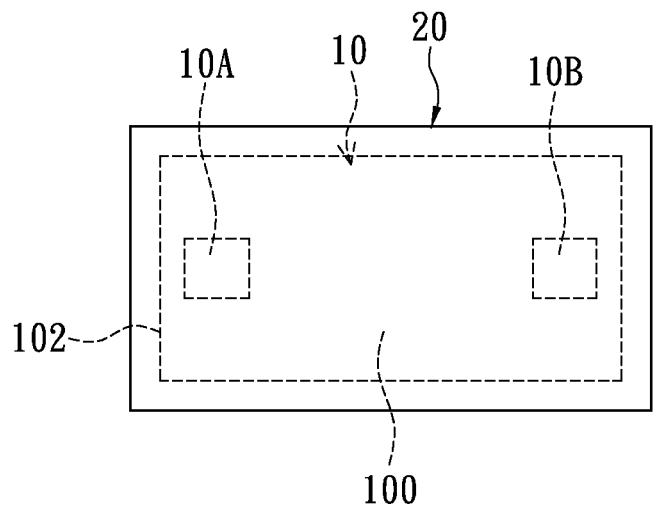
FIG. 2G is a schematic diagram of the step S112 of the method of manufacturing a semiconductor package structure according to the instant disclosure.

Then, referring to FIG. 1, FIG. 2F and FIG. 2G, the step S112 is that: cutting the package material 20' along the cutting lines 200' to form a plurality of package bodies 20, wherein the upper surface 100 and the surrounding peripheral surface 102 of each semiconductor chip 10 are covered by the corresponding package body 20.

Figure 2H:
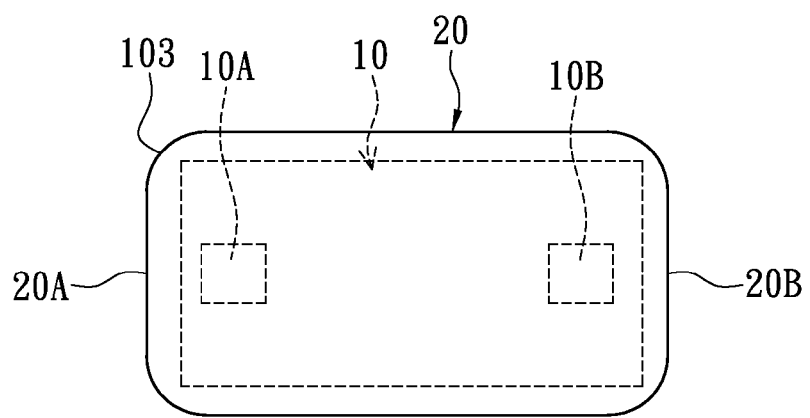
FIG. 2H is a schematic diagram of the step S114 of the method of manufacturing a semiconductor package structure according to the instant disclosure.

Afterward, referring to FIG. 1, FIG. 2G and FIG. 2H, the step S114 is that: forming a plurality of rounded corners 103 (shown as arc shapes) on edges of the package body 20, wherein each package body 20 has a first lateral portion 20A and a second lateral portion 20B respectively formed on two opposite lateral sides thereof. More precisely, when the rounded corners 103 are formed on the edges of the package body 20, the bonding strength of the following electronic structure covering the package body 20 can be increased.

Figure 2I:
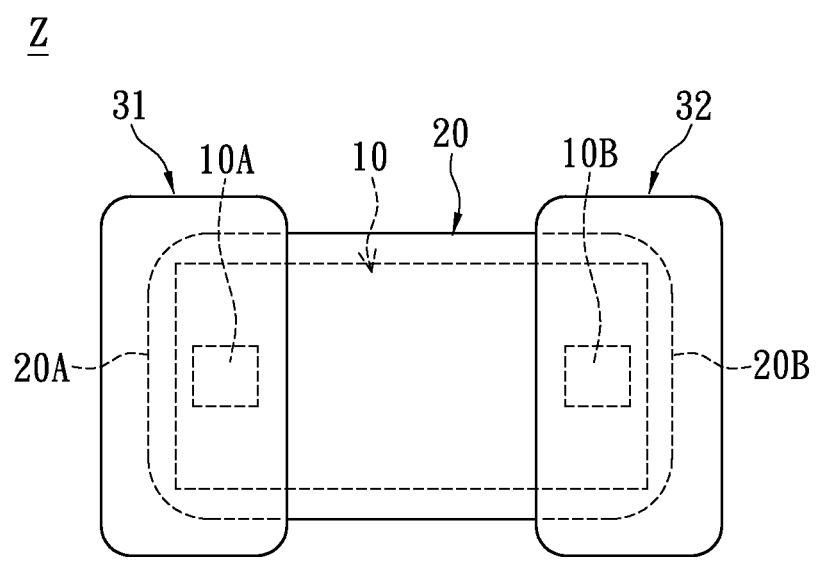
FIG. 2I is a schematic diagram of the step S116 of the method of manufacturing a semiconductor package structure according to the instant disclosure.

After that, referring to FIG. 1, FIG. 2H and FIG. 2I, the step S116 is that: forming a plurality of first electrode structures 31 and a plurality of second electrode structures 32, wherein each first electrode structure 31 is formed for firmly covering the first lateral portion 20A of the corresponding package body 20 through the corresponding rounded corners 103 and is electrically contacting the first conductive pad 10A of the corresponding semiconductor chip 10, and each second electrode structure 32 is formed for firmly covering the second lateral portion 20B of the corresponding package body 20 through the corresponding rounded corners 103 and is electrically contacting the second conductive pad 10B of the corresponding semiconductor chip 10.

Figure 3A:
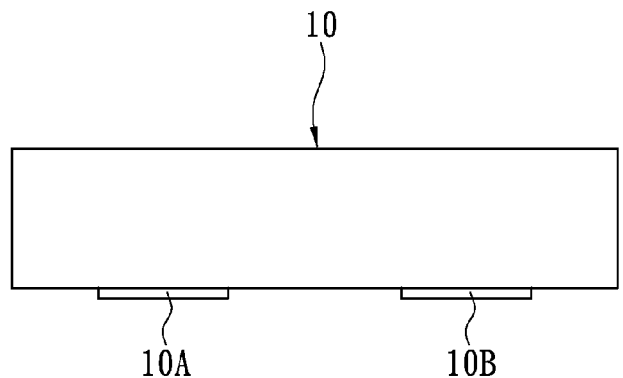
FIG. 3A shows a lateral, schematic view of the method of manufacturing a semiconductor package structure for providing a semiconductor chip according to the instant disclosure.
Figure 3B:
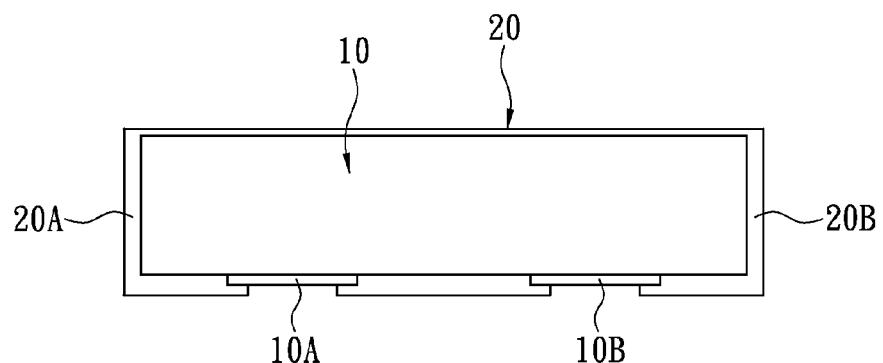
FIG. 3B shows a lateral, schematic view of the method of manufacturing a semiconductor package structure for forming a package body according to the instant disclosure.
Figure 3C:
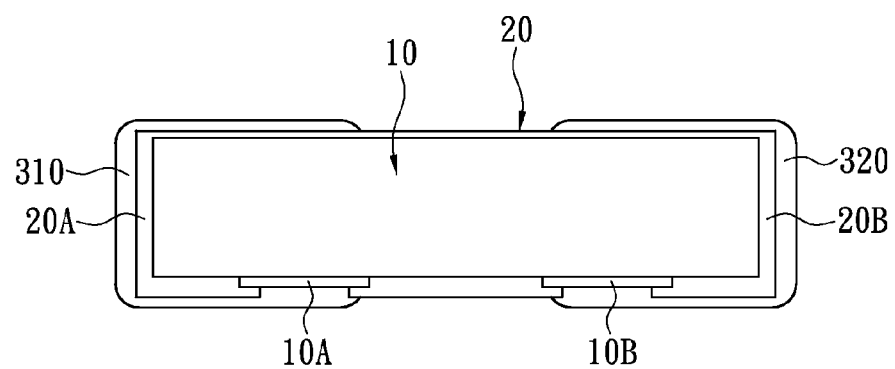
FIG. 3C shows a lateral, schematic view of the method of manufacturing a semiconductor package structure for forming a first inner conductive layer and a second inner conductive layer according to the instant disclosure.
Figure 3D:
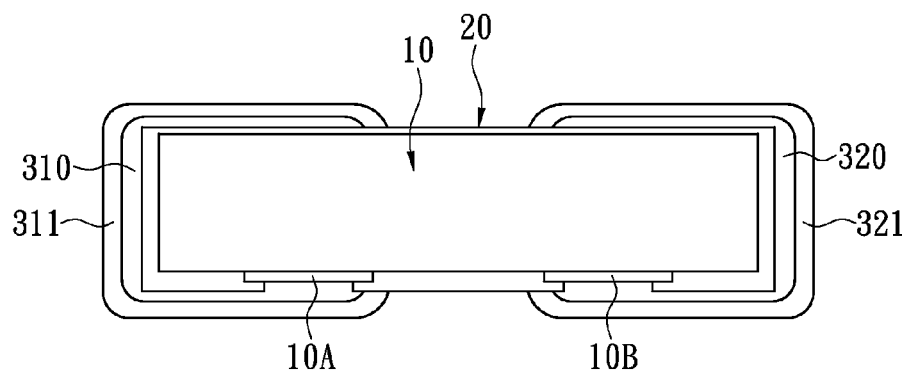
FIG. 3D shows a lateral, schematic view of the method of manufacturing a semiconductor package structure for forming a first middle conductive layer and a second middle conductive layer according to the instant disclosure.
Figure 3E:
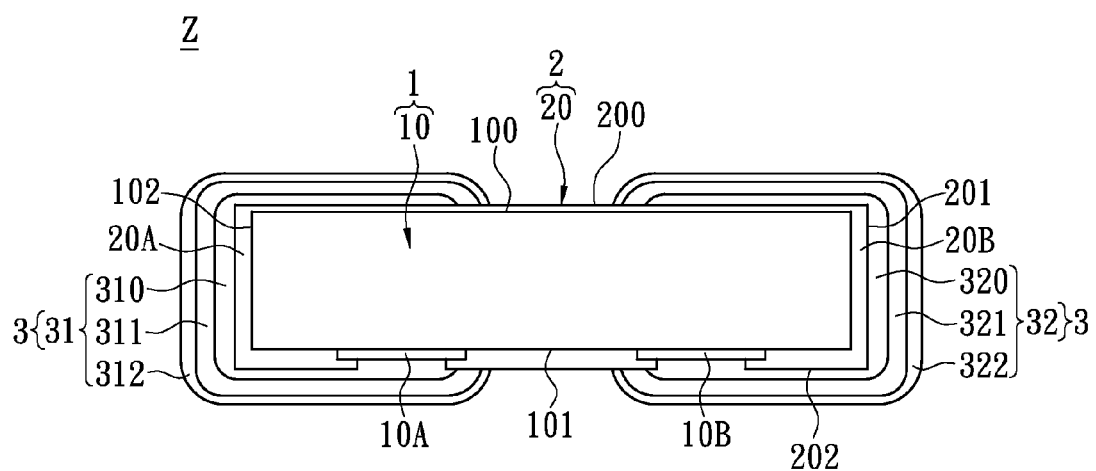
FIG. 3E shows a lateral, schematic view of the method of manufacturing a semiconductor package structure for forming a first outer conductive layer and a second outer conductive layer according to the instant disclosure.

For precisely, referring to FIG. 2I and FIG. 3C to FIG. 3E, the step S116 of forming the first electrode structures 31 and the second electrode structures 32 further comprises: forming a plurality of first inner conductive layers 310 and a plurality of second inner conductive layers 320 by dipping silver, wherein each first inner conductive layer 310 is formed for covering the first lateral portion 20A of the corresponding package body 20 and electrically contacting the first conductive pad 10A of the corresponding semiconductor chip 10, and each second inner conductive layer 320 is formed for covering the second lateral portion 20B of the corresponding package body 20 and electrically contacting the second conductive pad 10B of the corresponding semiconductor chip 10 (as shown in FIG. 3C); forming a plurality of first middle conductive layers 311 and a plurality of second middle conductive layers 321 by electroplating nickel (Ni), wherein each first middle conductive layer 311 is formed for covering the corresponding first inner conductive layer 310, and each second middle conductive layer 321 is formed for covering the corresponding second inner conductive layer 320 (as shown in FIG. 3D); and then forming a plurality of first outer conductive layers 312 and a plurality of second outer conductive layers 322 by electroplating tin (Sn), wherein each first outer conductive layer 312 is formed for covering the corresponding first middle conductive layer 311, and each second outer conductive layer 322 is formed for covering the corresponding second middle conductive layer 321.

Hence, referring to FIGS. 2I and 3, the instant disclosure can provide a semiconductor package structure Z through the steps from S100 to S116, comprising: a chip unit 1, a package unit 2 and an electrode unit 3.

First, the chip unit 1 includes at least one semiconductor chip 10, and the at least one semiconductor chip 10 has an upper surface 100, a lower surface 101 opposite to the upper surface 100, and a surrounding peripheral surface 102 connected between the upper surface 100 and the lower surface 101, and the at least one semiconductor chip 10 has a first conductive pad 10A and a second conductive pad 10B disposed on the lower surface 101 of the at least one semiconductor chip 10. Moreover, the package unit 2 includes a package body 20 covering the upper surface 100 and the surrounding peripheral surface 102 of the at least one semiconductor chip 10, and the package body 20 has a first lateral portion 20A and a second lateral portion 20B respectively formed on two opposite lateral sides of the package body 20. For example, the lower surface 101 of the at least one semiconductor chip 10 can be exposed from the package body 20, and the package body 20 has a plurality of rounded corners 103 formed on edges of the package body 20. In addition, the package body 20 has a top surface 200 corresponding to the upper surface 100 of the at least one semiconductor chip 10, a peripheral surface 201 extended downwardly from the top surface 200 and corresponding to the surrounding peripheral surface 102 of the at least one semiconductor chip 10, and a bottom surface 202 extended inwardly from the peripheral surface 201 for exposing the first conductive pad 10A and the second conductive pad 10B of the at least one semiconductor chip 10.

Furthermore, the electrode unit 3 includes a first electrode structure 31 covering the first lateral portion 20A of the package body 20 and a second electrode structure 32 covering the second lateral portion 20B of the package body 20, and the first electrode structure 31 and the second electrode structure 32 are separated from each other by a predetermined distance, and the first electrode structure 31 and the second electrode structure 32 respectively electrically contact the first conductive pad 10A and the second conductive pad 10B. For example, the first electrode structure 31 is formed to cover one one part of the top surface 200 of the package body 20, one part of the peripheral surface 201 of the package body 20, one part of the bottom surface 202 of the package body 20 and one part of the lower surface 101 of the at least one semiconductor chip 10, and the second electrode structure 32 is formed to cover another part of the top surface 200 of the package body 20, another part of the peripheral surface 201 of the package body 20, another part of the bottom surface 202 of the package body 20 and another part of the lower surface 101 of the at least one semiconductor chip 10. In addition, the first electrode structure 31 includes a first inner conductive layer 310 covering the first lateral portion 20A of the package body 20 and electrically contacting the first conductive pad 10A of the at least one semiconductor chip 10, a first middle conductive layer 311 covering the first inner conductive layer 310, and a first outer conductive layer 312 covering the first middle conductive layer 311. The second electrode structure 32 includes a second inner conductive layer 320 covering the second lateral portion 20B of the package body 20 and electrically contacting the second conductive pad 10B of the at least one semiconductor chip 10, a second middle conductive layer 321 covering the second inner conductive layer 320, and a second outer conductive layer 322 covering the second middle conductive layer 321.

Figure 4:
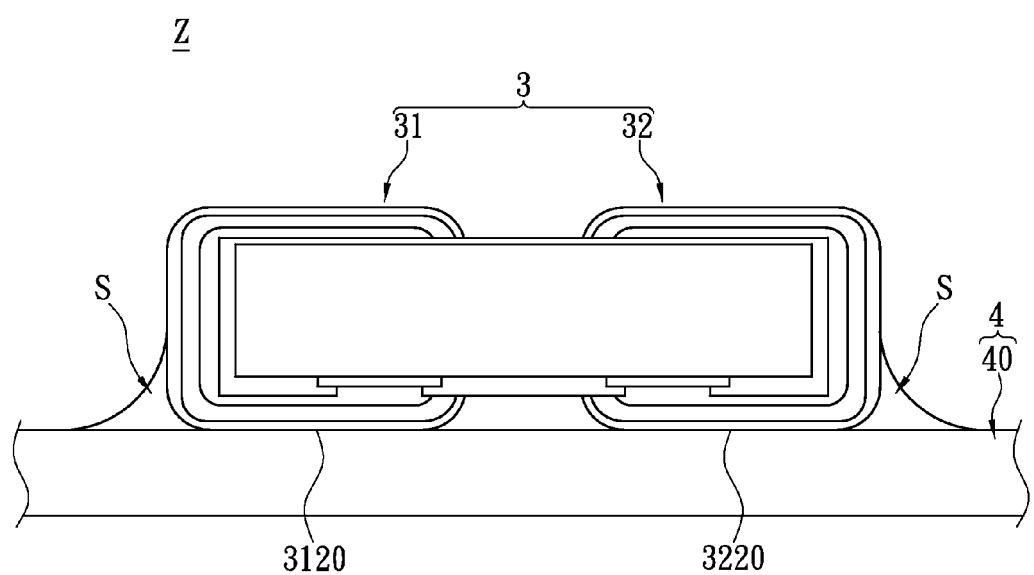
FIG. 4 shows a lateral, cross-sectional, schematic view of the semiconductor package structure disposed on the substrate body according to the instant disclosure.

More precisely, referring to FIG. 4, the semiconductor package structure Z further comprises a substrate unit 4 including a substrate body 40, and the first bottom side 3120 of the first electrode structure 31 and the second bottom side 3220 of the second electrode structure 32 electrically contact the substrate body 40, and the first electrode structure 31 and the second electrode structure 32 are respectively electrically connected to the substrate body 40 and positioned on the substrate body 40 through two solders S.

Figure 5A:
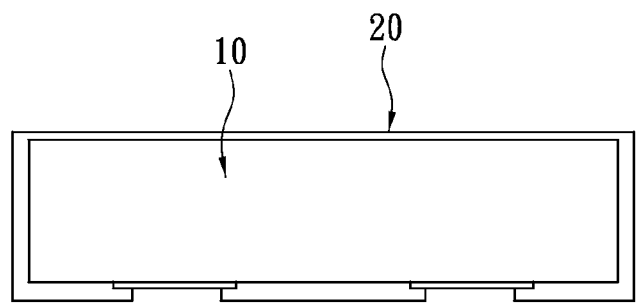
FIG. 5A shows a lateral, schematic view of the package body covering the semiconductor package structure according to the instant disclosure.
Figure 5B:
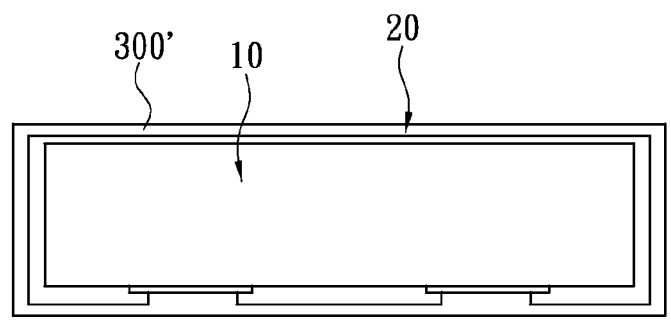
FIG. 5B shows a lateral, schematic view of forming a plurality of conductive materials by electroplating according to the instant disclosure.

Referring to FIG. 5A to FIG. 5G, the instant disclosure can use another method for executing the step S106, as follows:

First, referring to FIG. 5A and FIG. 5B, the method comprises: forming a plurality of conductive materials 300' by electroplating, wherein each conductive material 300' is formed for enclosing the corresponding package body 20 and the corresponding semiconductor chip 10.

Figure 5C:
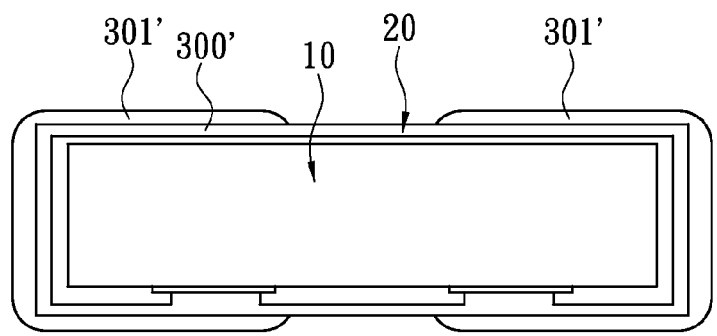
FIG. 5C shows a lateral, schematic view of forming a plurality of insulative materials according to the instant disclosure.

Next, referring to FIG. 5B and FIG. 5C, the method comprises: forming a plurality of insulative materials 301' (such as an anti-corrosion and anti-acid polymer material), wherein every two insulative materials 301' are formed for respectively covering two opposite end portions of the corresponding conductive material 300'.

Figure 5D:
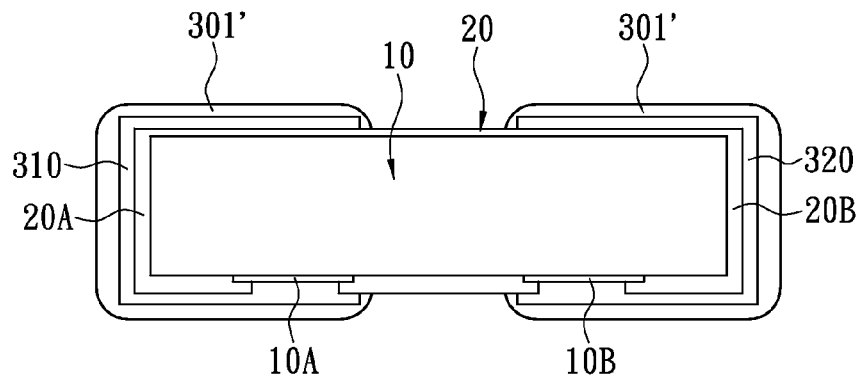
FIG. 5D shows a lateral, schematic view of removing one part of each conductive material by etching according to the instant disclosure.

Then, referring to FIG. 5C and FIG. 5D, the method comprises: removing one part of each conductive material 300' by etching to form a plurality of first inner conductive layers 310 and a plurality of second inner conductive layers 320, wherein each first inner conductive layer 310 is formed for covering the first lateral portion 20A of the corresponding package body 20 and electrically contacting the first conductive pad 10A of the corresponding semiconductor chip 10, and each second inner conductive layer 320 is formed for covering the second lateral portion 20B of the corresponding package body 20 and electrically contacting the second conductive pad 10B of the corresponding semiconductor chip 10.

Figure 5E:
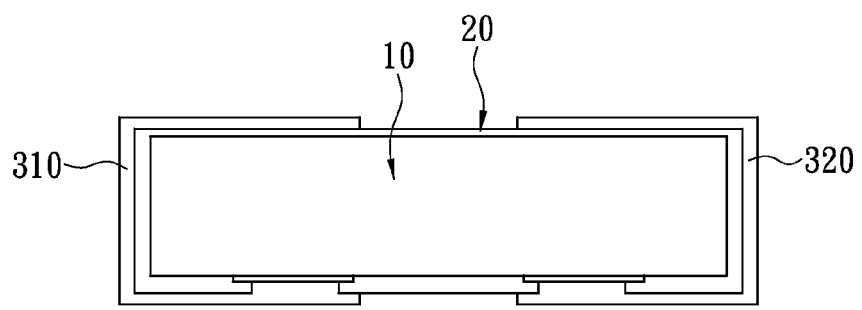
FIG. 5E shows a lateral, schematic view of removing the other insulative materials according to the instant disclosure.

Afterward, referring to FIG. 5D and FIG. 5E, the method comprises: removing the other insulative materials 301' to expose the first inner conductive layers 310 and the second inner conductive layers 320.

Figure 5F:
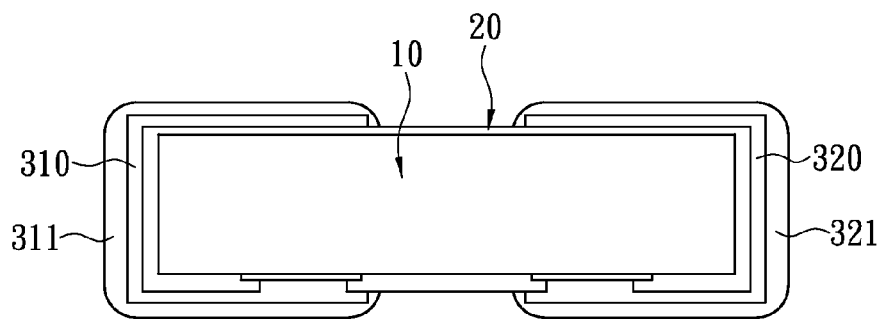
FIG. 5F shows a lateral, schematic view of forming a plurality of first middle conductive layers and a plurality of second middle conductive layers according to the instant disclosure.

After that, referring to FIG. 5E and FIG. 5F, the method comprises: forming a plurality of first middle conductive layers 311 and a plurality of second middle conductive layers 321, wherein each first middle conductive layer 311 is formed for covering the corresponding first inner conductive layer 310, and each second middle conductive layer 321 is formed for covering the corresponding second inner conductive layer 320.

Figure 5G:
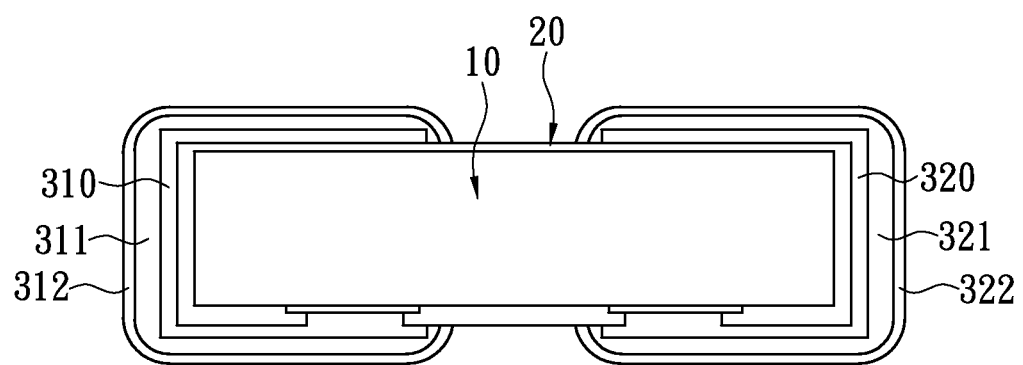
FIG. 5G shows a lateral, schematic view of forming a plurality of first outer conductive layers and a plurality of second outer conductive layers according to the instant disclosure.

Finally, referring to FIG. 5F and FIG. 5G, the method comprises: forming a plurality of first outer conductive layers 312 and a plurality of second outer conductive layers 322, wherein each first outer conductive layer 312 is formed for covering the corresponding first middle conductive layer 311, and each second outer conductive layer 322 is formed for covering the corresponding second middle conductive layer 321.

In conclusion, the package unit 2 includes a package body 20 covering the upper surface 100 and the surrounding peripheral surface 102 of the at least one semiconductor chip 10, and the receiving space R is filled with a package material 20' to enclose the semiconductor chips 10, thus the semiconductor package structure Z of the instant disclosure can be manufactured without using a chip-carrying substrate and a wire-bonding process.

The above-mentioned descriptions merely represent the preferred embodiments of the instant disclosure, without any intention or ability to limit the scope of the instant disclosure which is fully described only within the following claims. Various equivalent changes, alterations or modifications based on the claims of instant disclosure are all, consequently, viewed as being embraced by the scope of the instant disclosure.

What is claimed is:

1. A method of manufacturing a semiconductor package structure, comprising:
    cutting a wafer to form a plurality of semiconductor chips separated from each other, wherein each semiconductor chip has an upper surface, a lower surface opposite to the upper surface, and a surrounding peripheral surface connected between the upper surface and the lower surface, and each semiconductor chip has a first conductive pad and a second conductive pad disposed on the lower surface thereof;
    reversing and positioning each semiconductor chip in a receiving space for covering the first conductive pad and the second conductive pad of the corresponding semiconductor chip;
    filling the receiving space with a package material to enclose the semiconductor chips;
    cutting the package material to form a plurality of package bodies, wherein the upper surface and the surrounding peripheral surface of each semiconductor chip are covered by the corresponding package body, and each package body has a first lateral portion and a second lateral portion respectively formed on two opposite lateral sides thereof; and
    forming a plurality of first electrode structures and a plurality of second electrode structures, wherein each first electrode structure is formed for covering the first lateral portion of the corresponding package body and electrically contacting the first conductive pad of the corresponding semiconductor chip, and each second electrode structure is formed for covering the second lateral portion of the corresponding package body and electrically contacting the second conductive pad of the corresponding semiconductor chip.

2. The method of claim 1, wherein before the step of cutting the wafer, the method further comprises: forming the first conductive pad and the second conductive pad on the lower surface of each corresponding semiconductor chip by screen printing.

3. The method of claim 1, wherein the step of reversing and positioning each semiconductor chip further comprises: adhesively placing each semiconductor chip on an adhesive substrate that is received in the receiving space, wherein the semiconductor chips are separated from each other.

4. The method of claim 1, wherein the step of cutting the package material further comprises: forming a plurality of cutting lines on the top surface of the package material, wherein the package material is cut along the cutting lines.

5. The method of claim 1, wherein before the step of forming the first electrode structures and the second electrode structures, the method further comprises:
  forming a plurality of rounded corners on edges of the package body.

6. The method of claim 1, wherein the step of forming the first electrode structures and the second electrode structures further comprises:
  forming a plurality of first inner conductive layers and a plurality of second inner conductive layers, wherein each first inner conductive layer is formed for covering the first lateral portion of the corresponding package body and electrically contacting the first conductive pad of the corresponding semiconductor chip, and each second inner conductive layer is formed for covering the second lateral portion of the corresponding package body and electrically contacting the second conductive pad of the corresponding semiconductor chip;
  forming a plurality of first middle conductive layers and a plurality of second middle conductive layers, wherein each first middle conductive layer is formed for covering the corresponding first inner conductive layer, and each second middle conductive layer is formed for covering the corresponding second inner conductive layer; and
  forming a plurality of first outer conductive layers and a plurality of second outer conductive layers, wherein each first outer conductive layer is formed for covering the corresponding first middle conductive layer, and each second outer conductive layer is formed for covering the corresponding second middle conductive layer.

7. The method of claim 1, wherein the step of forming the first electrode structures and the second electrode structures further comprises:
  forming a plurality of conductive materials, wherein each conductive material is formed for enclosing the corresponding package body and the corresponding semiconductor chip;
  forming a plurality of insulative materials, wherein every two insulative materials are formed for respectively covering two opposite end portions of the corresponding conductive material;
  removing one part of each conductive material to form a plurality of first inner conductive layers and a plurality of second inner conductive layers, wherein each first inner conductive layer is formed for covering the first lateral portion of the corresponding package body and electrically contacting the first conductive pad of the corresponding semiconductor chip, and each second inner conductive layer is formed for covering the second lateral portion of the corresponding package body and electrically contacting the second conductive pad of the corresponding semiconductor chip;
  removing the other insulative materials to expose the first inner conductive layers and the second inner conductive layers;
  forming a plurality of first middle conductive layers and a plurality of second middle conductive layers, wherein each first middle conductive layer is formed for covering the corresponding first inner conductive layer, and each second middle conductive layer is formed for covering the corresponding second inner conductive layer; and
  forming a plurality of first outer conductive layers and a plurality of second outer conductive layers, wherein each first outer conductive layer is formed for covering the corresponding first middle conductive layer, and each second outer conductive layer is formed for covering the corresponding second middle conductive layer.

* * * * *